(12) United States Patent
Shen et al.

(10) Patent No.: US 11,018,014 B2
(45) Date of Patent: May 25, 2021

(54) DRY ETCHING METHOD

(71) Applicant: HITACHI HIGH-TECHNOLOGIES CORPORATION, Tokyo (JP)

(72) Inventors: Ze Shen, Tokyo (JP); Tetsuo Ono, Tokyo (JP); Hisao Yasunami, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 15/196,284

(22) Filed: Jun. 29, 2016

(65) Prior Publication Data

US 2016/0307765 A1 Oct. 20, 2016

Related U.S. Application Data

(62) Division of application No. 14/447,681, filed on Jul. 31, 2014, now abandoned.

(30) Foreign Application Priority Data

Oct. 8, 2013 (JP) .............................. JP2013-210656

(51) Int. Cl.
*H01L 21/311* (2006.01)
*H01L 21/3065* (2006.01)
*H01J 37/32* (2006.01)
*H01L 21/02* (2006.01)

(52) U.S. Cl.
CPC .... *H01L 21/3065* (2013.01); *H01J 37/32192* (2013.01); *H01J 37/32201* (2013.01); *H01L 21/02532* (2013.01)

(58) Field of Classification Search
CPC ............ H01L 21/3065; H01L 21/0234; H01L 21/30655; H01L 21/32136; H01L 21/32137
See application file for complete search history.

(56) References Cited

U.S. PATENT DOCUMENTS

| 5,155,657 A | 10/1992 | Oehrlein et al. |
| 2001/0028093 A1 | 10/2001 | Yamazaki et al. |
| 2006/0119548 A1* | 6/2006 | Lan ...................... G09G 3/3233 345/76 |

(Continued)

FOREIGN PATENT DOCUMENTS

| JP | S63-009121 A | 1/1988 |
| JP | H05-218301 A | 8/1993 |

(Continued)

OTHER PUBLICATIONS

Wolf et al.,"Silicon Processing for the VLSI Era, vol. 1—Process Technology", Lattice Press, California, 1986, pp. 521-535.*

(Continued)

*Primary Examiner* — Thomas T Pham
(74) *Attorney, Agent, or Firm* — Baker Botts L.L.P.

(57) ABSTRACT

A dry etching method for isotropically etching each of SiGe layers selectively relative to each of Si layers in a laminated film is provided. The laminated film can include Si layers and SiGe layers alternately and repeatedly laminated. Each of the SiGe layers can be plasma-etched with plasma generated by a pulse-modulated radio frequency power using $NF_3$ gas.

7 Claims, 8 Drawing Sheets

(56) References Cited

U.S. PATENT DOCUMENTS

| | | | |
|---|---|---|---|
| 2008/0073635 A1* | 3/2008 | Kiyotoshi | H01L 27/105 257/2 |
| 2008/0280404 A1* | 11/2008 | Chudzik | H01L 21/28079 438/199 |
| 2009/0008705 A1 | 1/2009 | Zhu et al. | |
| 2009/0068844 A1* | 3/2009 | Pischtiak | B08B 7/00 438/710 |
| 2012/0060915 A1* | 3/2012 | Chan | H01L 31/0236 136/256 |
| 2012/0091095 A1* | 4/2012 | Wang | H01J 37/3244 216/37 |
| 2012/0164809 A1 | 6/2012 | Yoon et al. | |
| 2013/0029492 A1 | 1/2013 | Inoue et al. | |
| 2013/0119018 A1* | 5/2013 | Kanarik | H05H 1/46 216/67 |
| 2013/0153970 A1* | 6/2013 | Eisele | H01L 21/02 257/254 |
| 2013/0241028 A1 | 9/2013 | Chen | |
| 2014/0349418 A1 | 11/2014 | Inoue et al. | |
| 2014/0361353 A1* | 12/2014 | Yin | H01L 21/28114 257/288 |

FOREIGN PATENT DOCUMENTS

| | | |
|---|---|---|
| JP | 2003-77888 A | 3/2003 |
| JP | 2007-214390 A | 8/2007 |
| JP | 2013-074091 A | 4/2013 |
| KR | 2001-0094985 A | 11/2001 |
| KR | 2012-0073727 A | 7/2012 |
| KR | 2013-0046407 A | 5/2013 |

OTHER PUBLICATIONS

Tan Ming, "Etching and Characterization of Advanced Gate Stack", National University of Singapore, 2004.*

Notification of Reasons for Refusal, dated Feb. 28, 2017, issued during the prosecution of Japanese Patent Application No. 2013-210656, which corresponds to the present application (English translation attached).

* cited by examiner

FIG. 7A

| | GAS FLOW RATE (ml/min) | | PRESSURE (Pa) | MICROWAVE | | | BIAS (W) | TIME (s) |
|---|---|---|---|---|---|---|---|---|
| | N₂ | NF₃ | | POWER (W) | PULSE FREQUENCY (Hz) | DUTY RATIO (%) | | |
| COMPARATIVE EXAMPLE | 20 | 80 | 0.5 | 400 | – | 100 | 0 | 30 |
| PRESENT INVENTION | 20 | 80 | 0.5 | 400 | 1000 | 20 | 0 | 30 |

FIG. 7B

| STEP | GAS FLOW RATE (ml/min) | | PRESSURE (Pa) | MICROWAVE | | | BIAS (W) | TIME (s) |
|---|---|---|---|---|---|---|---|---|
| | O₂ | CF₄ | | POWER (W) | PULSE FREQUENCY (Hz) | DUTY RATIO (%) | | |
| 1 | 0 | 190 | 2 | 800 | 1000 | 50 | 0 | 5 |
| 2 | 5 | 190 | 2 | 800 | 1000 | 20 | 0 | 25 |

FIG. 7C

| STEP | GAS FLOW RATE (ml/min) | | | PRESSURE (Pa) | MICROWAVE | | | BIAS (W) | TIME (s) |
|---|---|---|---|---|---|---|---|---|---|
| | O₂ | CF₄ | HBr | | POWER (W) | PULSE FREQUENCY (Hz) | DUTY RATIO (%) | | |
| 1 | 0 | 0 | 150 | 0.8 | 600 | – | 100 | 100 | 5 |
| 2 | 3 | 0 | 150 | 0.8 | 600 | – | 100 | 100 | 20 |
| 3 | 0 | 190 | 0 | 2 | 800 | 1000 | 50 | 0 | 5 |
| 4 | 5 | 190 | 0 | 2 | 800 | 1000 | 20 | 0 | 25 |

DRY ETCHING METHOD

CROSS REFERENCE TO PRIOR APPLICATIONS

The present application is a divisional application of U.S. patent application Ser. No. 14/447,681 filed on Jul. 31, 2014, which claims benefit of priority to Japanese Patent Application No. 2013-210656 filed on Oct. 8, 2013, the contents of all of which are hereby incorporated by reference into this application.

BACKGROUND OF THE INVENTION

The present invention relates to a dry etching method, particularly to a dry etching method capable of selective side etching on a laminated film.

In recent years there is an increasing need for semiconductor devices employing new materials other than silicon (hereinafter, described as "Si") due to the acceleration of the speed of field effect transistors. One of such new materials is silicon-germanium (hereinafter, described as "SiGe"). As semiconductor device structure employing such SiGe there is known laminated structure with Si layers and SiGe layers as shown in FIG. 3A, which is expected to be applied for semiconductor devices in the 22 nm generation and thereafter. In this laminated structure with Si layers and SiGe layers it is required to isotropically etch each of the SiGe layers selectively relative to each of the Si layers.

With regard to the selective etching of a SiGe layer relative to a Si layer, a method for etching a SiGe film to remove a SiGe film in a portion of a substrate not covered with a mask is disclosed in JP-A-2003-77888, where the SiGe film is dry-etched using a mixed gas composed of a reactive gas in which a hydrogen atom and fluorine atom are bonded to each other, argon gas and oxygen gas. In this etching SiGe is etched by chemical dry etching, thereby stopping etching at the underlying Si.

With regard to the selective isotropic etching of a SiGe layer relative to a Si layer, a microwave plasma-etching method for etching a hetero structure including a SiGe (silicon-germanium) layer and Si (silicon) layer formed on the SiGe (silicon-germanium) layer is disclosed in JP-A-2007-214390, where the SiGe (silicon-germanium) layer is isotropically etched selectively by using only fluoride gas as reactive gas with its flow rate in a range of 10 to 800 sccm, under a treatment pressure of 266 Pa or below, with a microwave power of 150 to 400 W, and at a treatment temperature of 5 to 25° C.

SUMMARY OF THE INVENTION

Even when the isotropic etching is tried on the laminated structure with Si layers and SiGe layers shown in FIG. 3A using either method of the prior arts, a selection ratio of SiGe etching relative to Si etching is not sufficient enough. Moreover these etching have two issues described below.

The first issue is that the thicknesses of each of Si layers and SiGe layers both are about 20 nm or less, and therefore, it becomes required to etch a narrower space between the upper and lower Si layers as etching of the SiGe layer proceeds in etching of this structure comparing with the conventional etching.

The second issue is that the above described narrow space requires to be formed by side etching, however, the side etching makes the ion incidence difficult. In ordinary etching in the vertical direction, a radio frequency bias is applied and enables the ion incidence to a surface to be etched even when the space is narrow, thereby being able to sputter re-deposited byproducts, if generated, to allow etching to proceed. For the side etching in the laminated structure with Si layers and SiGe layers shown in FIG. 3A, however, removal of the re-deposited byproducts is more obstructive due to the difficult ion incidence comparing with the conventional structure.

In order to solve these problems, the present invention provides a dry etching method for plasma-etching a sample having structure composed of Si layers and SiGe layers alternately and repeatedly laminated, in which each of the SiGe layers can be isotropically etched selectively relative to each of the Si layers.

In order to solve the problems described above, the present invention plasma-etches each of SiGe layers with pulse-modulated plasma using $NF_3$ gas in a dry etching method for isotropically etching each of the SiGe layers selectively relative to each of Si layers in a laminated film composed of the Si layers and SiGe layers alternately and repeatedly laminated.

Also, the present invention plasma-etches each of SiGe layers with pulse-modulated plasma using fluorocarbon gas in a dry etching method for isotropically etching each of the SiGe layers selectively relative to each of Si layers in a laminated film composed of the Si layers and SiGe layers alternately and repeatedly laminated.

Further, the present invention forms a groove having a predetermined depth with continuous plasma and then plasma-etches each of SiGe layers with pulse-modulated plasma using $NF_3$ gas or fluorocarbon gas in a dry etching method for isotropically etching each of the SiGe layers selectively relative to each of Si layers in a laminated film composed of the Si layers and SiGe layers alternately and repeatedly laminated.

The present invention is capable of isotropically etching each of SiGe layers selectively relative to each of Si layers in a dry etching method for plasma-etching a sample having structure composed of the Si layers and SiGe layers alternately and repeatedly laminated.

Other objects, features and advantages of the invention will become apparent from the following description of the embodiments of the invention taken in conjunction with the accompanying drawings.

BRIEF DESCRIPTION OF THE DRAWINGS

FIGS. 7A to 7C are tables showing etching conditions in the first to third embodiments according to the present invention, respectively.

DETAILED DESCRIPTION OF THE EMBODIMENTS

Figure 1:
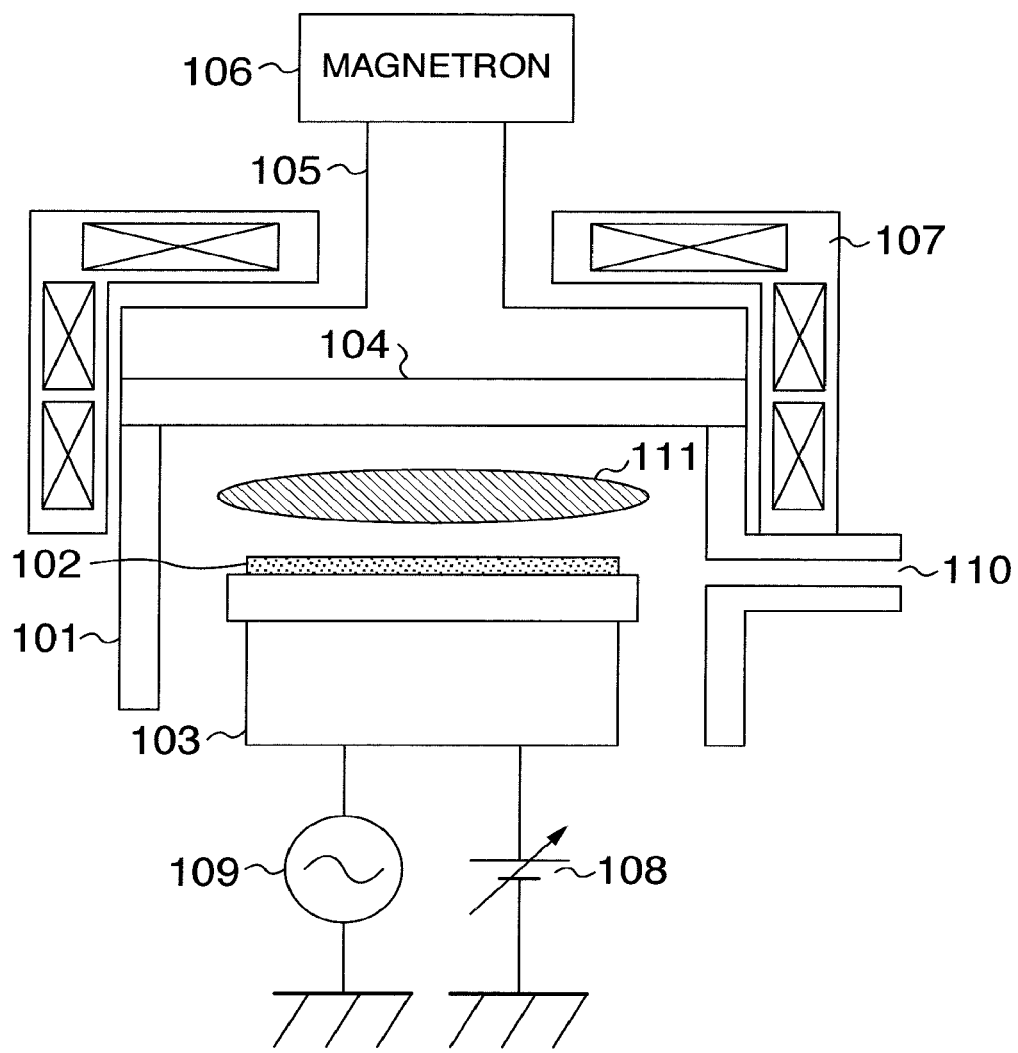
FIG. 1 is a schematic cross section of a plasma-etching apparatus according to the present invention.

Embodiments according to the present invention will be illustrated referring to FIGS. 1 to 7C. FIG. 1 is a schematic cross section showing one example of a plasma-etching apparatus to practice the present invention, which is a microwave plasma-etching apparatus of Electron Cyclotron Resonance (hereinafter, abbreviated as ECR) type which uses microwave and magnetic field for generating plasma.

This ECR type microwave plasma-etching apparatus includes a chamber 101 which can be evacuated, sample stage 103 on which wafer 102, i.e., a sample, is mounted, microwave-transmitting window 104 which is made of quarts and the like and arranged on a upper surface of the chamber 101, wave guide 105 and magnetron 106 which are arranged on the microwave-transmitting window 104, solenoid coil 107 arranged around the chamber 101, power supply for electrostatic chuck 108 and radio frequency power supply 109 which are connected to the sample stage 103.

The wafer 102 is carried in from a wafer carrying-in port 110 into the chamber 101 and then electrostatically attracted to the sample stage 103 by the power supply for electrostatic chuck 108. Etching gas is then introduced into the chamber 101. The inside of the chamber 101 is evacuated by a vacuum pump (not shown in figure) to be adjusted to a predetermined pressure, e.g., in the range of 0.1 Pa to 50 Pa. Microwave with a frequency of 2.45 GHz is then oscillated from the magnetron 106 to be propagated through the wave guide 105 into the chamber 101.

Figure 2A:
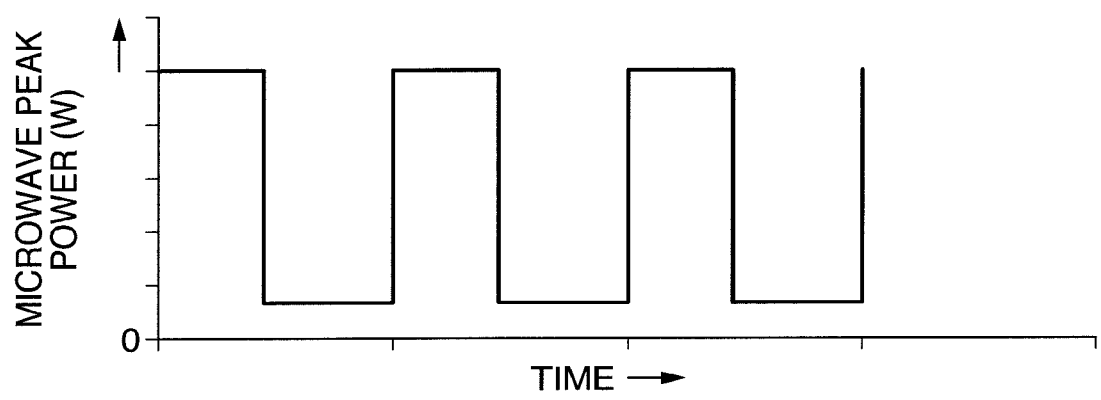
FIGS. 2A and 2B are drawings showing a pulse-modulated microwave power.
Figure 2B:
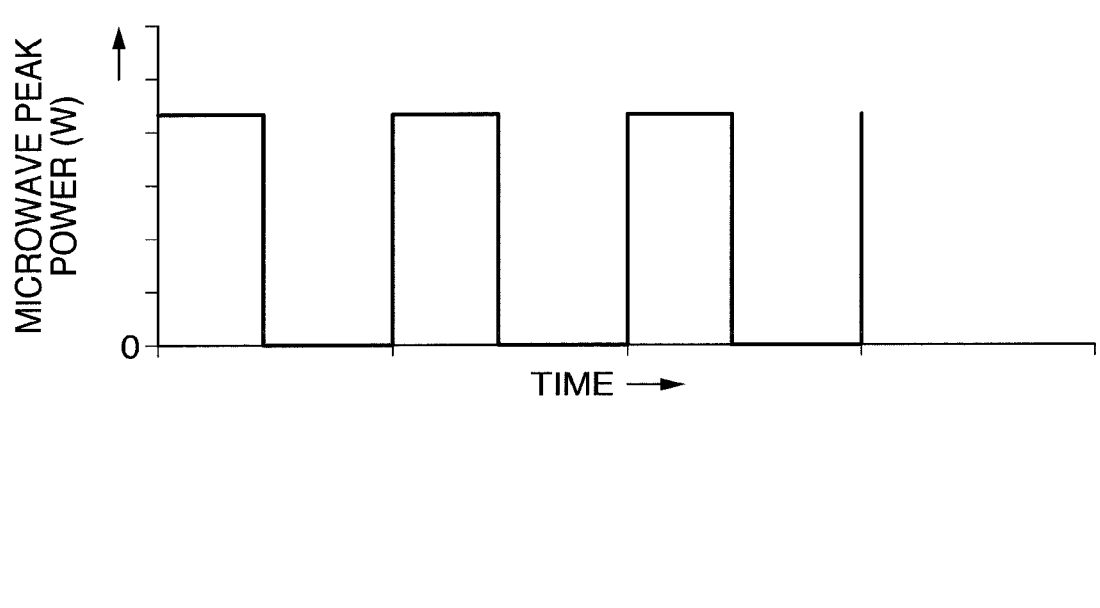

Additionally, the microwave described above can be pulse-modulated with pulses generated by a pulse generator (not shown in figure). For example, the microwave peak power oscillated from the magnetron 106 is periodically varied as shown in FIGS. 2A and 2B so that a field intensity of plasma is periodically varied. A plasma density is reduced at the periods when the microwave peak power is low as shown in FIG. 2A or at those when the microwave peak power is not applied as shown in FIG. 2B.

An interaction between the microwave and magnetic field generated by the solenoid coil 107 excites the etching gas to form plasma 111 in the space above the wafer 102. On the other hand a radio frequency bias is applied to the sample stage 103 by the radio frequency power supply 109, whereby ions in the plasma 111 are accelerated vertically to the wafer 102 to be made incident thereto. The wafer 102 is anisotropically etched by the action of the radicals and ions from the plasma 111.

Each embodiment of the present invention using the above described ECR type microwave plasma-etching apparatus will be illustrated below.

First Embodiment

Figure 3A:
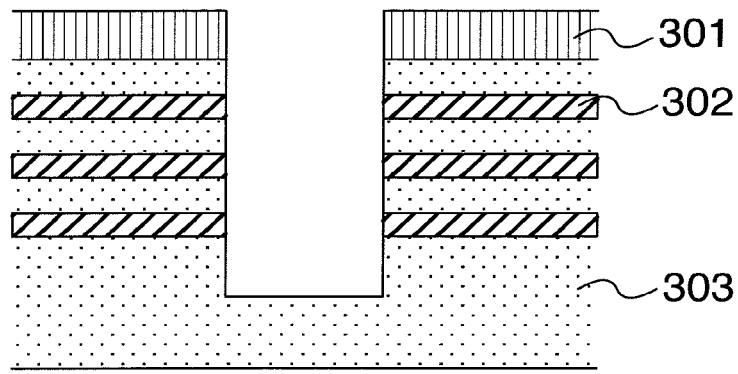
FIGS. 3A to 3C are drawings showing results of plasma-etching according to the present invention.

First of all, the thin film structure of the wafer 102 to be plasma-etched by the method according to the present invention is shown in FIG. 3A. The wafer 102 has an oxide film 301 as a mask for etching, underlying laminated structure composed of Si layers 303 and SiGe layers 302 alternately laminated, and a groove with a predetermined depth which have been formed in advance. It is noted that the Si layers 303 and SiGe layers 302 are layers composed of crystalline Si and crystalline SiGe formed through an epitaxial growth method, respectively.

The wafer 102 having the laminated structure shown in FIG. 3A was etched under etching conditions in the Comparative Example shown in FIG. 7A where 80 ml/min of nitrogen trifluoride (hereinafter, described as $NF_3$) gas and 20 ml/min of nitrogen (hereinafter, described as $N_2$) gas were used and a pressure of 0.5 Pa, microwave power of 400 W, and radio frequency bias applied to the wafer 102 of 0 W were set in order to reduce impact on Si due to the ions and allow the ions to reach the side walls of the small grooves and holes without fail.

Figure 3B:
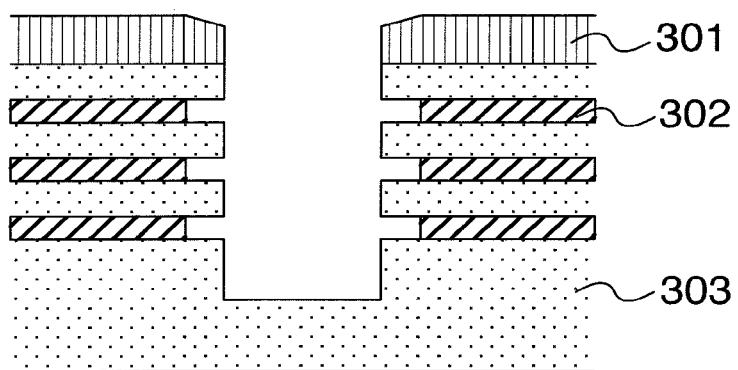

The $NF_3$ gas supplies fluorine to etch the SiGe layers and the $N_2$ gas forms a depositing component. The above described microwave power was a power of continuous output. As a result of etching under the etching conditions of the Comparative Example described above, the SiGe layers 302 were able to be side etched selectively relative to the Si layers 303 in the laminated film with the Si layers 303 and SiGe layers 302 as shown in FIG. 3B. It is noted that side etching and isotropic etching are the same in this example.

Figure 3C:
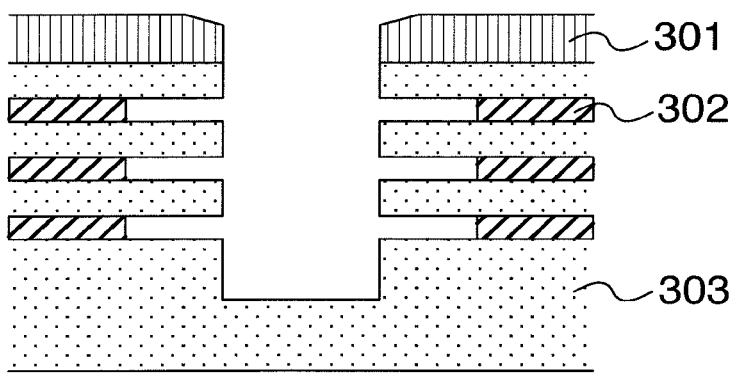

Next, the wafer 102 having the laminated structure shown in FIG. 3A was etched under the etching conditions of the present invention shown in FIG. 7A, and consequently, the SiGe layers 302 were successfully side etched selectively relative to the Si layers 303 as shown in FIG. 3C. In addition the side etching rate for the SiGe layers 302 under the etching conditions of the present invention was approximately quadrupled of that under the etching conditions of the Comparative Example described above. That is, the selection ratio of the SiGe layers relative to the Si layers was improved nearly fourfold under the etching conditions of the present invention. The etching conditions of the present invention were set by just modifying the microwave power of 400 W in the etching conditions of the Comparative Example to that pulse-modulated. It is noted that in the present invention the repeating frequency of the pulse-modulation and duty ratio were set at 1000 Hz and 20%, respectively. A duty ratio refers to a ratio of an on-period to a cycle period of pulses.

The improvement in the selective side etching of the SiGe layers relative to the Si layers by the present invention is thought to be attributable to the discussion below.

Figure 4A:
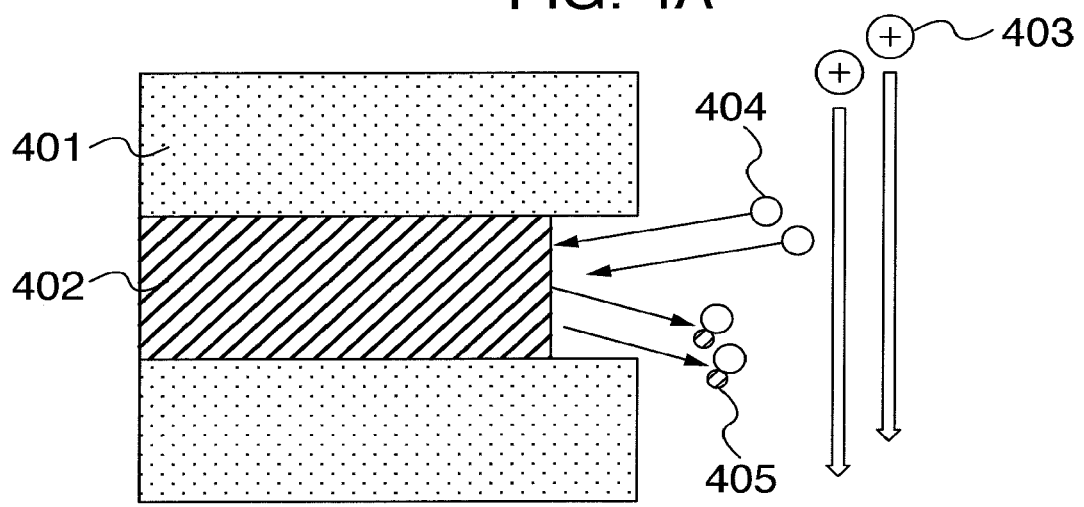
FIGS. 4A to 4C are drawings illustrating effect of the present invention.
Figure 4B:
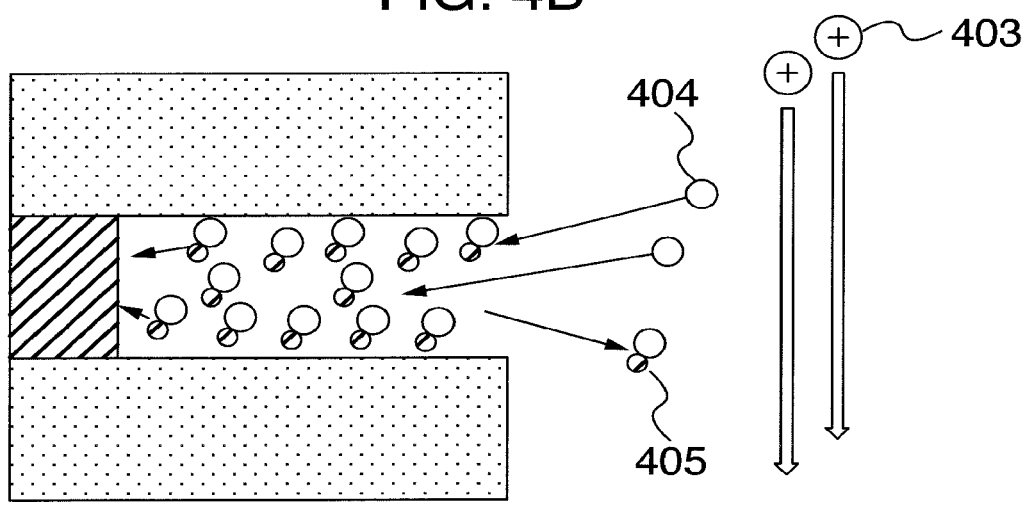
Figure 4C:
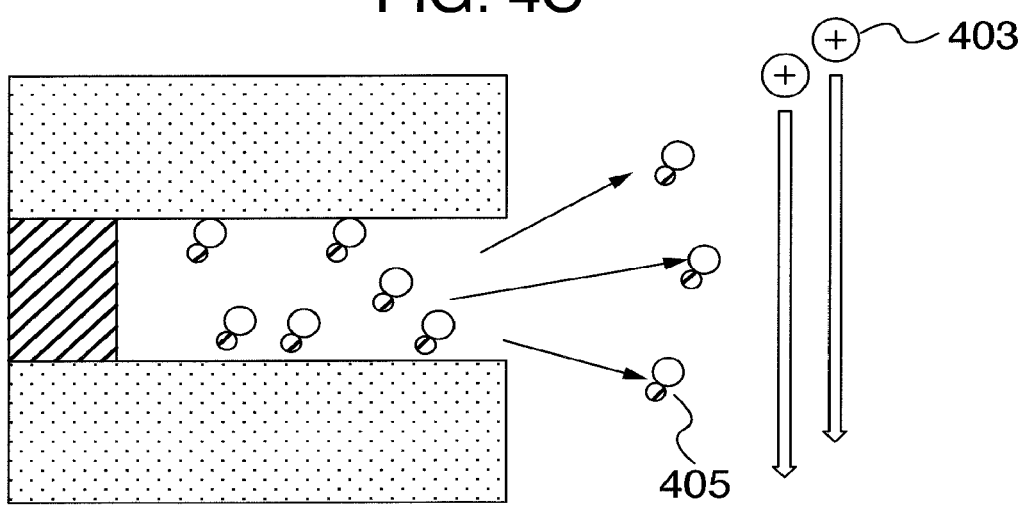

FIGS. 4A to 4C are schematic enlarged cross sections of a part of a laminated film composed of alternately and repeatedly laminated Si layers 401 and SiGe layers 402. Ions 403 from plasma are not made incident to the side walls of the Si layers 401 and SiGe layer 402 due to the vertical incidence thereof to the laminated film. In addition etching proceeds through a reaction of reactive radicals 404 of fluorine and the like with the more reactive SiGe. As shown in FIG. 4A an aspect ratio of etching is small at an initial period and therefore byproducts 405 are exhausted from the groove without collision.

As etching proceeds and the surface to be etched of the SiGe layer 402 retreats, a density of the byproducts 405 is increased inside the groove as shown in FIG. 4B, thereby increasing the re-incident byproducts 405 to the SiGe layer 402 due to collision. Thus the side etching of the SiGe layer 402 is inhibited so that the selection ratio relative to the Si layers 401 is decreased.

On the other hand, there are caused periods when supply of the reactive radicals 404 pauses by periodically weakening the plasma intensity or pausing the plasma in the present invention. Stopping the supply of the reactive radicals leads to suspension of the formation of the byproducts 405, whereby the byproducts 405 are sufficiently exhausted from the narrow groove as shown in FIG. 4C to be able to decrease the amount of the byproducts 405 re-deposited. Since the etching rate is not to be depressed at the next period of radical supply, a higher etching rate is to be obtained than that in the case of continuous etching. This effect is larger than that in the conventional etching in vertical direction where the ions are made incident. In addition, since it is possible to continuously control the amount and quality of the deposition attached to the side walls of the laminated film composed of the Si layers and SiGe layers, SiGe can be etched while stopping etching Si by utilizing differential of physicochemical properties such as a vapor pressure between Si and SiGe. The depositing radicals are omitted in FIGS. 4A to 4C.

That is, in the case of continuous output of the microwave, with progress of etching the SiGe surface to be etched gradually moves deep in the space between the upper and lower Si layers so as to reduce the conductance, and therefore, the density of the byproducts of the SiGe etching near the surface is heightened so as to increase the amount of the byproducts re-deposited on the surface to be etched, thereby decreasing the SiGe etching rate. On the other hand in the case of pulse discharge, it is considered that pauses of the radical generation at the microwave-off periods stop etching and the byproducts are exhausted outward from the groove at such periods, whereby the SiGe etching rate is accelerated comparing with continuous discharge, resulting in the improved selectivity.

Additionally, as a function for the effect of the present invention the discussion described below may be considered. Namely, it is particularly effective to increase a ratio of radicals to ions for performing selective side etching. At the off-periods in pulse discharge the ratio of radicals to ions is increased since attenuation of ions is larger than that of radicals at such periods. Therefore it may be considered that more selective etching was able to be performed in pulse discharge having the off-periods than in continuous discharge. Furthermore from the above discussion, it is considered to be also suggested that control of the duty ratio which controls the off-periods could control the selection ratio of SiGe relative to Si.

Figure 5:
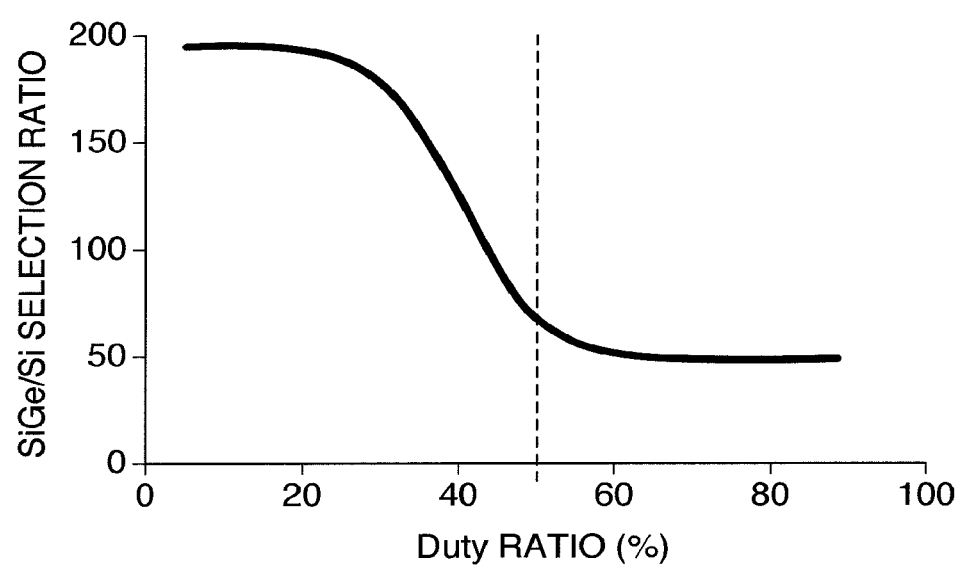
FIG. 5 is a drawing showing dependence of a duty ratio of pulse-modulation on a selection ratio of SiGe side etching relative to Si side etching.

Then, dependence of the duty ratio of pulse-modulation on the selection ratio of SiGe side etching relative to Si side etching will be illustrated. As shown in FIG. 5 the selection ratio was increased as the duty ratio of pulse-modulation was decreased, and particularly, the selection ratio was significantly increased when pulse duty ratio is 50% or less. This characteristic of the duty ratio with respect to the selection ratio may be understood as follows.

At first when the duty ratio of pulse-modulation is decreased in the range from 100% to 50%, a long on-period results in formation of the deposition on the SiGe surface before switching to an off-period and a certain amount of the deposition remains after the elapse of the short off-period. Therefore decrease of the duty ratio of pulse-modulation is less effective for the progress of SiGe etching.

On the other hand, when the duty ratio of pulse-modulation is decreased in the range from 50% to 20%, an off-period starts due to the shortened on-period before the byproducts attain the level capable of forming the re-deposition and disturbing etching. Therefore decrease of the byproduct level at the off-periods is so effective for the progress of SiGe etching that the selection ratio is drastically increased. When the duty ratio of pulse-modulation is decreased to less than 20%, however, the decreased radical formation at the on-periods rather than the improved inhibition of etching by the byproducts described above is considered to be rate-limiting, thereby practically saturating the selection ratio.

Alternatively, since the ratio of the radicals to the ions is mostly increased with increased off-periods in pulse discharge as described above, it may be considered that the decreased duty ratio of pulse-modulation resulted in the increased selection ratio of SiGe relative to Si, and particularly with the duty ratio of pulse-modulation of 50% or less, the increased ratio of the radicals to ions exhibited a significant effect.

That is, the pulsed discharge can lead to controlling time of etching with radicals and an amount of re-deposition of byproducts in a narrow space such as a groove, as well as increasing a ratio of radicals to ions, whereby a selection ratio of SiGe side etching relative to Si can be enhanced. The selection ratio also can be further enhanced with the reduced duty ratio of pulse-modulation. In the present invention the selection ratio of SiGe side etching relative to Si can be significantly enhanced particularly with the reduced duty ratio of pulse-modulation of 50% or less.

Although $N_2$ gas was used as an additional gas in this embodiment, any of $O_2$ gas, $CO_2$ gas, and CO gas may be used in place of $N_2$ gas.

An embodiment in which the wafer 102 having the laminated structure shown in FIG. 3A is etched in two steps will then be illustrated.

Second Embodiment

When etching is performed under the etching conditions in the first embodiment, an amount of side etching of SiGe shows a tendency to be increased over etching time and at an initial period of etching byproducts are easily evacuated from the inside of the groove due to a small aspect ratio. Therefore a higher selection ratio can be obtained by changing the etching conditions depending on the amount of side etching of SiGe.

Thus, etching was performed under etching conditions of using $CF_4$ gas and a duty ratio of microwave pulse-modulation of 50% in step 1 and using $CF_4$ gas mixed with $O_2$ gas for inhibiting shaving of corner parts of the groove and a duty ratio of microwave pulse-modulation of 20% in step 2 as shown in FIG. 7B. As a result, the selection ratio and the shaving of corner parts of the groove were able to be improved better than the case under the etching conditions in the first embodiment. In addition, the etching conditions may be changed such that steps in this embodiment are increased not limiting to two steps or the duty ratio of pulse-modulation is continuously decreased from 50% to 20% within the treating period.

Although illustration has been made with an example using $CF_4$ gas in the this embodiment, the present invention is not limited to this example and fluorocarbon gas such as $CHF_3$ gas, $CH_2F_2$ gas, or $CH_3F$ gas may be used. Further, although $O_2$ gas was used as an additional gas in the this embodiment, any of $N_2$ gas, $CO_2$ gas, and CO gas may be used in place of $O_2$ gas.

Examples in which a wafer having structure with a pre-formed groove as shown in FIG. 3A was etched have been illustrated in the first and second embodiments but an embodiment in which formation of a groove and selective side etching of SiGe layers relative to Si layers are consistently performed will then be illustrated below.

Third Embodiment

Figure 6A:
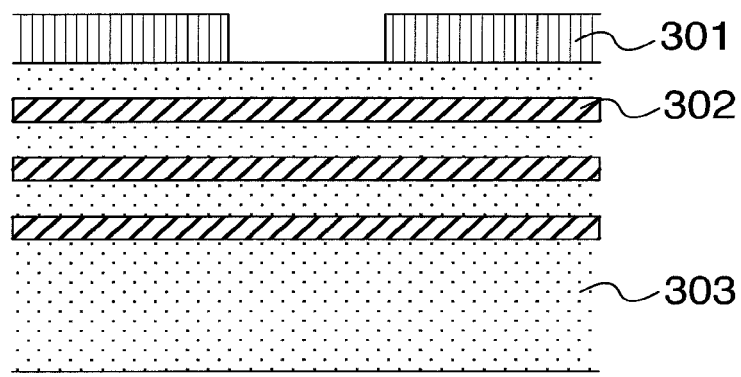
FIGS. 6A to 6C are drawings showing results of plasma-etching according to the present invention in a third embodiment.

FIG. 6A is a cross section of structure of a wafer to be etched in the this embodiment and the structure of the wafer shown in FIG. 6A is that composed of an oxide film 301 as a mask for a groove pattern and underlying Si layers 303 and SiGe layers 302 alternately laminated.

At first a naturally oxidized film on the surface of the Si layer 303 in a part not covered with the oxide film 301 as the mask was removed under conditions of step 1 shown in FIG.

Figure 6B:
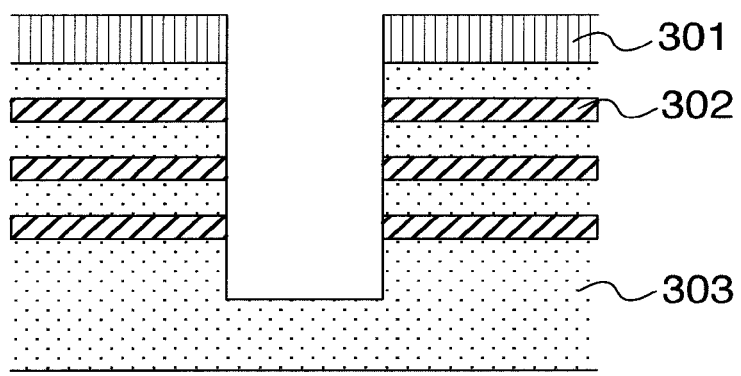
Figure 6C:
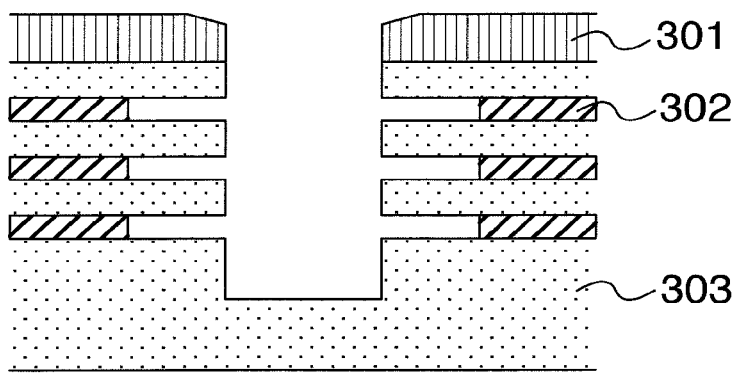

7C and then a groove with a predetermined depth was formed under conditions of step 2 shown in FIG. 7C as shown in FIG. 6B. Subsequently deposition, such as Br, accumulated on the side walls of the groove during formation of the groove was removed under conditions of step 3 shown in FIG. 7C and then the SiGe layers 302 were selectively side-etched relative to the Si layers 303 under conditions of step 4 using pulse discharge shown in FIG. 7C to successfully obtain a desired etched shape as shown in FIG. 6C.

It is noted that the step 3 described above is not necessarily an essential step since it is a step for removal of the deposition such as Br. When the step 3 is not performed, the etching conditions in the first embodiment may be employed for step 4.

In this way, it is possible to consistently perform forming a groove and selective side etching of SiGe relative to Si on the structure composed of the Si layers 303 and SiGe layers 302 alternately laminated as shown in FIG. 6A by etching employing continuous discharge and pulse discharge in combination shown in FIG. 7C.

Although selective side etching of SiGe relative to Si has been illustrated with examples using $NF_3$ gas in the first embodiment and $CF_4$ gas in the second embodiment as stated above, the present invention is not limited to these embodiments and fluorocarbon gas such as $CHF_3$ gas, $CH_2F_2$ gas, or $CH_3F$ gas may be used.

Further, although illustration has been made with a case using an ECR type microwave plasma-etching apparatus in the first to third embodiments described above, the present invention can also be applied to an etching apparatus with other type of plasma generation such as a capacitively coupled type plasma-etching apparatus or inductively coupled type plasma-etching apparatus. In this case, the same effect as those of the aforesaid embodiments can be also obtained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A dry etching method for isotropically etching SiGe layers selectively relative to Si layers in a laminated film composed of the Si layers and SiGe layers alternately laminated, the method comprising:
    a step of plasma etching a groove using a continuous radio frequency power that results in a first ratio of radicals to ions;
    a step of plasma-etching the SiGe layers with plasma generated by a pulse-modulated radio frequency power, using a mixed gas consisting of a $NF_3$ gas and a $N_2$ gas; and
    a step of setting the pulse-modulated radio frequency power to a duty ratio of 50% or less;
    wherein a duty ratio of the pulse-modulated radio frequency power is set to a duty ratio that results in a second ratio of radicals to ions that is higher than the first ratio of radicals to ions,
    wherein a correlation data between a selection rate of the SiGe layer etching relative to a selection rate of the Si layer etching and a duty ratio of the pulse-modulation is acquired, and wherein a duty ratio of the pulse-modulated radio frequency power is set according to the acquired correlation data.

2. The dry etching method according to claim 1, wherein the step of setting the pulse-modulated radio frequency power to a duty ratio of 50% or less comprises setting the pulse-modulated radio frequency power to a duty ratio of between 20% and 50%.

3. The dry etching method according to claim 1, wherein the step of setting the pulse-modulated radio frequency power to a duty ratio of 50% or less comprises setting the pulse-modulated radio frequency power to a duty ratio of between 20% and 50%, and wherein the method further comprises forming a re-deposition and inhibiting the plasma-etching of SiGe layer during on-time of the pulse modulated radio frequency power.

4. A dry etching method for isotropically etching SiGe layers selectively relative to Si layers in a laminated film composed of the Si layers and SiGe layers alternately laminated, the method comprising:
    a step of plasma-etching the SiGe layers with plasma generated by a pulse-modulated radio frequency power, using a mixed gas consisting of a $NF_3$ gas and a $N_2$ gas;
    a step of setting a duty ratio of the pulse-modulated radio frequency power to a duty ratio of 50% or less; and
    a step of applying the pulse-modulated radio frequency power to a sample stage on which a sample having the laminated film is mounted,
    wherein the radio frequency power is applied to the sample stage.

5. The dry etching method according to claim 4, wherein the step of setting a duty ratio of the pulse-modulated radio frequency power to a duty ratio of 50% or less comprises setting the pulse-modulated radio frequency power to a duty ratio between 20% and 50%.

6. A dry etching method for isotropically etching SiGe layers selectively relative to Si layers in a laminated film composed of the Si layers and SiGe layers alternately laminated, the method comprising:
    a step of plasma etching a groove using a continuous radio frequency power that results in a first ratio of radicals to ions;
    a step of plasma-etching the SiGe layers with plasma generated by a pulse-modulated radio frequency power, using a mixed gas consisting of a $NF_3$ gas and a $N_2$ gas; and
    a step of setting the pulse-modulated radio frequency power to a duty ratio of 50% or less;
    wherein a duty ratio of the pulse-modulated radio frequency power is set to a duty ratio that results in a second ratio of radicals to ions that is higher than the first ratio of radicals to ions.

7. A dry etching method for isotropically etching SiGe layers selectively relative to Si layers in a laminated film composed of the Si layers and SiGe layers alternately laminated, the method comprising:
    a step of plasma-etching the SiGe layers with plasma generated by a pulse-modulated radio frequency power, using a mixed gas consisting of a $NF_3$ gas and a $N_2$ gas.

* * * * *